United States Patent
Hoshino et al.

(10) Patent No.: US 8,524,188 B2
(45) Date of Patent: Sep. 3, 2013

(54) METHOD FOR PURIFYING METALLURGICAL SILICON FOR SOLAR CELLS

(76) Inventors: Masahiro Hoshino, Los Altos, CA (US); Cheng C. Kao, Los Altos, CA (US)

( * ) Notice: Subject to any disclaimer, the term of this patent is extended or adjusted under 35 U.S.C. 154(b) by 0 days.

(21) Appl. No.: 13/539,183

(22) Filed: Jun. 29, 2012

(65) Prior Publication Data

US 2012/0275985 A1    Nov. 1, 2012

Related U.S. Application Data

(63) Continuation of application No. 13/024,292, filed on Feb. 9, 2011, now Pat. No. 8,236,265, which is a continuation of application No. 13/023,467, filed on Feb. 8, 2011.

(60) Provisional application No. 61/374,213, filed on Aug. 16, 2010.

(30) Foreign Application Priority Data

Feb. 12, 2010   (CN) .................................. 99 1 04551

(51) Int. Cl.
    *C01B 33/021*    (2006.01)
(52) U.S. Cl.
    USPC .......................................... 423/349; 423/348
(58) Field of Classification Search
    USPC ................. 423/345–350; 422/209, 232, 233; 420/578; 373/60, 61, 67–70, 78; 432/262–265; 219/121.36–121.38, 121.48–121.59
    See application file for complete search history.

(56) References Cited

U.S. PATENT DOCUMENTS

| 4,298,423 A | 11/1981 | Lindmayer |
| 4,865,643 A | 9/1989 | Goins, Jr. et al. |
| 4,940,486 A | 7/1990 | Sommerville et al. |

(Continued)

FOREIGN PATENT DOCUMENTS

| JP | 05262512 A | 10/1993 |
| JP | 2001526171 A | 12/2001 |

(Continued)

OTHER PUBLICATIONS

Office Action from the U.S. Patent Office, dated Sep. 20, 2012, for U.S. Appl. No. 13/023,467.

(Continued)

*Primary Examiner* — Ngoc-Yen Nguyen
*Assistant Examiner* — Justin Bova

(57) ABSTRACT

A method includes transferring a raw silicon material in a crucible and subjecting the raw silicon material in the crucible to thermal energy to form a melted silicon material at a temperature of less than 1400 Degrees Celsius, the melted silicon material having an exposed region bounded by an interior region of the crucible, subjecting an exposed inner region of the melted silicon material to an energy source to include an arc heater configured above the exposed region and to be spaced by a gap between the exposed region and a muzzle region of the arc heater to form a determined temperature profile within a vicinity of an inner region of the exposed melted silicon material while maintaining outer regions of the melted silicon material at a temperature below a melting point of the crucible, and removing impurities from the melted silicon material to form higher purity silicon.

18 Claims, 11 Drawing Sheets

(56) References Cited

U.S. PATENT DOCUMENTS

| | | | |
|---|---|---|---|
| 5,104,096 A | | 4/1992 | Goins et al. |
| 5,182,091 A | * | 1/1993 | Yuge et al. ............ 423/348 |
| 5,700,308 A | | 12/1997 | Pal et al. |
| 5,961,944 A | * | 10/1999 | Aratani et al. ............ 423/348 |
| 5,989,021 A | | 11/1999 | Sato et al. |
| 6,090,361 A | | 7/2000 | Baba et al. |
| 6,143,073 A | | 11/2000 | Christman et al. |
| 6,994,835 B2 | | 2/2006 | Sasatani et al. |
| 7,686,887 B2 | | 3/2010 | Ohama et al. |
| 8,236,265 B2 | | 8/2012 | Hoshino et al. |
| 8,257,492 B2 | | 9/2012 | Hoshino et al. |
| 2006/0048698 A1 | | 3/2006 | Hall et al. |
| 2006/0054081 A1 | * | 3/2006 | Lan et al. ............ 117/217 |
| 2008/0123715 A1 | | 5/2008 | Trassy et al. |
| 2008/0311020 A1 | | 12/2008 | Ito et al. |
| 2009/0130014 A1 | | 5/2009 | Fukuyama et al. |
| 2010/0178195 A1 | | 7/2010 | Yamada et al. |

FOREIGN PATENT DOCUMENTS

| | | |
|---|---|---|
| JP | 2007326749 A | 12/2007 |
| JP | 2008308383 A | 12/2008 |
| JP | 2010269992 A | 12/2010 |
| KR | 100966755 B1 | 6/2010 |
| WO | WO 2008149985 A1 | 11/2008 |

OTHER PUBLICATIONS

Ciftja et al, "Refining and Recycling of Silicon: A Review", Norwegian University of Science and Technology, Feb. 2008, pp. 1-40, Trondheim, Norway.

Office Action from the U.S. Patent Office, dated Oct. 15, 2012, for U.S. Appl. No. 13/536,919.

Office Action from the U.S. Patent Office, dated Dec. 7, 2012, for U.S. Appl. No. 13/541,319.

Office Action and List of References for U.S. Appl. No. 12/947,777 mailed Jun. 5, 2012 from the United States Patent and Trademark Office.

International Search Report for PCT/US2010/056903 filed on Nov. 16, 2010.

Written Opinion of the International Searching Authority for PCT/US2010/056903 filed on Nov. 16, 2010.

The International Search Report for PCT/US2011/024572 filed on Feb. 11, 2011.

Office Action and List of References for U.S. Appl. No. 13/187,282 mailed Dec. 9, 2011 from the United States Patent and Trademark Office.

N. Yuge et al., "Purification of Metallurgical-Grade Silicon up to Solar Grade", Progress in Photovoltaics, May/Jun. 2001, pp. 203-209, vol. 9-3.

C.P. Khattak et al., "Production of Solar Grade (SoG) Silicon by Refining Liquid Metallurgical Grade (MG) Silicon", National Renewable Energy Laboratory, Apr. 19, 2001.

Written Opinion of the International Searching Authority for PCT/US2011/024572 filed on Feb. 11, 2011.

Office Action and List of References for U.S. Appl. No. 12/947,777 mailed Jan. 27, 2012 from the United States Patent and Trademark Office.

Liang et al., "Study on the recycle of solar grade silicon from waste IC wafers," Proceedings of ISES Solar World Congress 2007: Solar Energy and Human Settlement, pp. 1189-1193.

International Search Report for PCT/US2011/044890 filed on Jul. 21, 2011.

Written Opinion of the International Searching Authority for PCT/US2011/044890 filed on Jul. 21, 2011.

Office Action and List of References for U.S. Appl. No. 13/187,282 mailed Mar. 23, 2012 from the United States Patent and Trademark Office.

Notice of Allowance for U.S. Appl. No. 13/024,292 dated May 22, 2012.

Office Action and List of References for U.S. Appl. No. 13/024,292 dated Oct. 27, 2011 from the United State Patent and Trademark Office.

Office Action and List of References for U.S. Appl. No. 13/024,292 dated Mar. 21, 2012 from the United States Patent and Trademark Office.

Notice of Allowance for U.S. Appl. No. 13/187,282 dated Apr. 27, 2012.

Office Action from the U.S. Patent Office, dated Jan. 25, 2013, for U.S. Appl. No. 13/023,467.

Notice of Allowance for U.S. Appl. No. 13/023,467 dated Apr. 18, 2013.

* cited by examiner

METHOD FOR PURIFYING METALLURGICAL SILICON FOR SOLAR CELLS

CROSS REFERENCE TO RELATED APPLICATIONS

This application is a continuation of U.S. non-provisional application Ser. No. 13/024,292, filed on Feb. 9, 2011, which claims priority to U.S. Ser. No. 61/374,213 filed on Aug. 16, 2010, U.S. Ser. No. 13/023,467 filed on Feb. 8, 2011 and Republic of China Patent Application No. 099104551 filed on Feb. 12, 2010, commonly assigned, and hereby incorporated by reference herein.

BACKGROUND OF THE INVENTION

The present invention relates to an apparatus and method for purifying materials. More particularly, the present invention relates to a method and system for purifying metallurgical silicon fields to produce raw materials suitable for manufacturing single crystal silicon ingots and poly crystal silicon ingots for solar cells at a lower cost. Although the above has been described in terms of purifying silicon, it can be applied to other applications.

Conventional polysilicon silicon material used for manufacturing solar cells is often produced by the so-called Siemens process. Such process is well established, stable, and produces silicon with certain quality for manufacturing solar cells. The Siemens process, however, has limitations. That is, the Siemens' process, due to the nature of its manufacturing process, is difficult to adjust and has failed to meet the dramatic increase in demand and the need for lower prices over the past few years. In addition, it involves use of poisonous raw materials such as HCl and $SiHCl_3$ during the manufacturing process and produces a poisonous by-product, $SiCl_4$. These materials are also highly explosive. The Siemens process is also dangerous and not environmentally friendly.

Alternatively, silicon purification methods that use metallurgy have been proposed. Such purification methods, however, have limitations. That is, such methods have not been able to achieve production scale. Certain other efforts have been achieved using metallurgy techniques. Unfortunately, the ability to scale of the equipment for such techniques is enormous, and thus the production costs are still high. These and other limitations may be overcome by the present techniques described throughout the present specification and more particularly below.

From the above, it is seen that improved techniques for producing silicon are highly desired.

SUMMARY OF THE INVENTION

The present invention relates to an apparatus and method for purifying materials. More particularly, the present invention relates to a method and system for purifying metallurgical silicon fields to produce raw materials suitable for manufacturing single crystal silicon ingots and poly crystal silicon ingots for solar cells at a lower cost. Although the above has been described in terms of purifying silicon, it can be applied to other applications.

The manufacturing methods mentioned above produce silicon with quality high enough for solar cells. But with increasing demands for cleaner and more flexible production, lower cost, and mass production capability, the conventional method has limitations. Depending upon the embodiment, one or more of these limitations may be overcome.

In a specific embodiment, the present invention provides a system for forming high quality silicon material, e.g., polysilicon. In a specific embodiment, the melted material comprises a silicon material and an impurity, e.g., phosphorous species. The system includes a crucible having an interior region. In a specific embodiment, the crucible is made of a suitable material such as a quartz material or others. The quartz material is capable of withstanding a temperature of at least 1400 Degrees Celsius for processing silicon. In a specific embodiment, the crucible is configured in an upright position and has an open region to expose a melted material. In a specific embodiment, the present system has an energy source. Such energy source may be an arc heater or other suitable heating device, including multiple heating devices, which may be the same or different. The arc heater is configured above the open region and spaced by a gap between the exposed melted material and a muzzle region of the arc heater to cause formation of a determined temperature profile within a vicinity of a center region of the exposed melted material while maintaining outer regions of the melted material at a temperature below a melting point of the quartz material of the crucible. In a specific embodiment, the system produces a melted material comprising a resulting phosphorous species of 0.1 ppm and less, which is purified silicon.

In a specific embodiment, the present invention provides a method for forming high quality silicon material, e.g., polysilicon. The method includes transferring a raw silicon material in a crucible having an interior region. The crucible is made of a quartz or other suitable material, which is capable of withstanding a temperature of at least 1400 Degrees Celsius. The method includes subjecting the raw silicon material in the crucible to thermal energy to cause the raw silicon material to be melted into a liquid state to form a melted material at a temperature of less than about 1400 Degrees Celsius. Preferably, the melted material has an exposed region bounded by the interior region of the crucible. The method also includes subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible. Preferably, the method removes one or more impurities from the melted material to form a higher purity silicon material in the crucible.

In a specific embodiment, the arc heater is a plasma gun configured to emit an excited argon species to cause thermal transfer to a portion of the melted material. In a specific embodiment, the arc heater is configured to subject a selected portion of the exposed region of the melted material. The arc heater is configured with a thermal transfer device to cause cooling of the arc heater. In a specific embodiment, the arc heater is capable of being ignited by a source. Preferably, the arc heater comprises a power rating of 20 kWatt and greater and capable of being pulsed according to a duty cycle of about 30%~50%, and others. For example: 30% duty cycle means 30% on, then 70% off, which is interpreted by one of ordinary skill in the art. In a specific embodiment, the muzzle region has a maximum dimension of about 0.5 centimeters to about 2 centimeters. Of course, there can be other variations, modifications, and alternatives.

In a specific embodiment, the temperature profile is determined to achieve a certain result. That is the temperature profile is a maximum temperature profile greater than about 3000 Degrees to cause removal of phosphorous entities from the melted material. In a preferred embodiment, such temperature has been important to remove any phosphorous impurities and/or entities from a silicon material melt. In a specific embodiment, the melted material within the crucible is characterized by a convective flow caused by a temperature gradient formed by at least the maximum temperature profile and lower temperatures within a vicinity of edges of the melted material. In a specific embodiment, the convective flow causes a mixing within the melted material. In a preferred embodiment, the flow is also turbulent to facilitate mixing within the melted material.

In a preferred embodiment, the system and method also have a nozzle region configured to output argon gas to cause a dimple region within a vicinity of the center region of the melted material. In one or more embodiments, the nozzle region is a plurality of nozzles or the like. In a specific embodiment, the dimple region provides an increased surface region for a plume to interact with the melted material; wherein the dimple region has a depth of at least one centimeter and greater. Preferably, the increased surface region is at least three times greater than a surface region without the dimple region or more preferably, the increased surface region is at least five times greater than a surface region without the dimple region. As an example of silicon, the melted material comprises a viscosity of 0.7 Pascal-second, which may be slightly more or less. In a preferred embodiment, the argon gas comprises a flow rate of 5 l/min to 20 l/min. In a specific embodiment, the gas impinging on the melted material forms the dimple region that is characterized by a plurality of recessed regions each of which is separated by an elevated region. In a specific embodiment, the nozzle region coupled to the argon gas source is made of a ceramic material. Preferably, the argon gas source is operable independent from operation of energy of the arc tube. In a preferred embodiment, the argon gas source is 99.99% purity and greater. In other embodiments, other suitable gases that are non-reactive may be used. Of course, there can be other variations, modifications, and alternatives.

In a preferred embodiment, the present system and method use a cover gas or pressing gas to enclose a substantial portion of the melted material within the crucible. That is, the crucible is subject to a cover gas to maintain the melted material within the crucible. In a preferred embodiment, the crucible is subject to an argon containing cover gas or other suitable inert gas or gases to maintain the melted material within the crucible. Preferably, the cover gas is suitable to maintain the melted material free from oxidation or other undesirable conditions. The cover gas is provided within a chamber and/or housing enclosing the crucible. Of course, there can be other variations, modifications, and alternatives.

In a preferred embodiment, the system and method also include a carrier gas configured to cause a portion of evaporated melted material to return to the melted material. In a specific embodiment, the carrier gas can be argon or other inert gas, which is suitable to return any evaporated melted material consisting of silicon entities back into the melted material. In a specific embodiment, the system includes a plurality of surface regions configured to cause a substantial portion of a phosphorus species to be exhausted while returning a substantial portion of silicon species into the melted material. Preferably, the surface regions comprise a plurality of fin regions configured to cause a substantial portion of a phosphorus species to be exhausted while returning a substantial portion of silicon species into the melted material. Of course, there can be other variations, modifications, and alternatives.

In other embodiments, the present invention includes an apparatus for purifying metallurgical silicon that overcomes limitations of conventional techniques. In a specific embodiment, the present method and system modify a conventional single crystal silicon puller apparatus, which usually includes a vessel, a crucible, a crucible support and a heater. By implementing at least one of the following means in the existing apparatus, purification of metallurgical silicon is performed using one, some or all of the devices simultaneously:

an independent injecting device provided above the crucible for providing plasma, gases and chemicals required for purifying in a high-speed jet flow to the surface of a silicon melt, and forming a dimple on the surface of the silicon melt by its supplying tubes, and in cooperation with a temperature profile across the silicon melt due to a temperature gradient, facilitating heat circulation and increasing the circulation inversion radius, as well as increasing the contact area between the purifying gases and chemicals and the silicon melt, thereby increasing purification efficiency;

a guiding element with fins thereon, provided above the silicon melt in the crucible at an appropriate location with respect to the crucible and the supplying tubes for supplying the purifying gases and chemicals, for guiding damped gas flow rising from the surface of the silicon melt as a result of heating of the silicon melt back to the surface of the silicon melt, so that the damped gases effectively contact the silicon melt, wherein the distance between the guiding element and the surface of the silicon melt, the distance between the fins and the silicon melt, and the distance between the interior circumference of the crucible and the fins are critical;

a manipulating device provided underneath the vessel for vertically and horizontally shifting and rotating the crucible with respect to the heater to adjust the solidus-liquidus interface to obtain one-directional cooling purification without the need for temperature segregation coefficient management of the concentration of remaining impurities in the silicon melt with respect to the solidus-liquidus line, therefore allowing effective backflow of the damped gases and controlling the form of the dimple created by the jet flow from the injecting device on the surface of the silicon melt by adjusting the distance between the crucible and the guiding element, wherein a set of valves capable of horizontal shifting is further provided in the manipulating device in order to reduce reactions of carbon parts with oxygen when the crucible is taken out or inserted into the vessel by opening/closing the vessel; and a vacuum pump provided to regulate the pressure or degree of vacuum inside the vessel and to accommodate evaporating conditions for various impurities.

According to a specific embodiment, the present technique overcomes some or all of these limitations by adding simple structures such as an independent gas and chemical injecting device, a crucible shifting manipulating device, a gas flow guiding element, and a vacuum pump to regulate the pressure inside the vessel, so that with these small modifications, purification efficiency can be improved. Meanwhile, the apparatus is simple, is easy to maintain, is with small modifications to an existing single crystal silicon puller apparatus, and has a short building time; therefore, the cost can be reduced, and mass production is possible. In addition, the apparatus of the present technique does not use poisonous raw materials and produces no poisonous by-products, while ensuring the safety of the purification process.

According to a specific embodiment, the present invention provides an apparatus for purifying metallurgical silicon obtained by modifying an existing single crystal silicon puller apparatus including a vessel, a crucible, a crucible support and a heater. The apparatus includes one, some, or all of the following devices for the purification of metallurgical silicon: an independent injecting device above the crucible for providing plasma, gases and chemicals required for purifying in a high-speed jet flow to the surface of a silicon melt; a guiding element above the silicon melt in the crucible at an appropriate location for guiding gas coming from the surface of the silicon melt back to the surface of the silicon melt; a manipulating device underneath the vessel for vertically and horizontally shifting and rotating the crucible with respect to the heater and the guiding element to obtain optimum purification efficiency; and a vacuum pump to regulate the pressure or degree of vacuum inside the vessel and to accommodate evaporating conditions for various impurities.

Many benefits are achieved by way of the present invention over conventional techniques. For example, the present technique provides an easy to use process that relies upon conventional technology. In some embodiments, the method provides highly purified silicon material using a modular approach. In preferred embodiments, the present method and system uses one or more of (1) nozzle for gas in making dimple region(s) in the melted material; (2) cover gas or environment for maintaining the melted material; and (3) carrier gas or environment for returning vaporized melted material back into the melt. Additionally, the method provides a process and system that are compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention relates to an apparatus and method for purifying materials. More particularly, the present invention relates to a method and system for purifying metallurgical silicon fields to produce raw materials suitable for manufacturing single crystal silicon ingots and poly crystal silicon ingots for solar cells at a lower cost. Although the above has been described in terms of purifying silicon, it can be applied to other applications.

The implementations of the present invention are described using the embodiments below.

Figure 1:
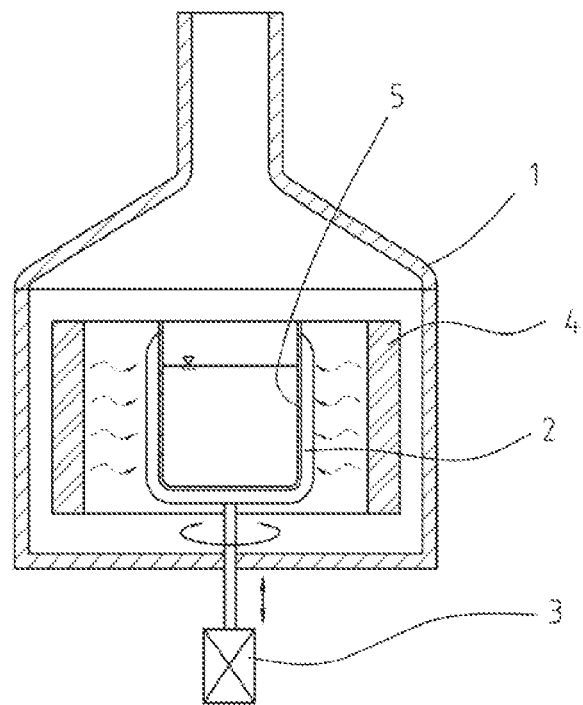
FIG. 1 is a cross-sectional diagram depicting a simplified traditional apparatus for growing single crystal silicon ingots.

FIG. 1 is a cross-sectional diagram depicting a simplified apparatus typical for growing single crystal silicon ingot. This diagram is merely an example, which should not unduly limit the scope of the claims herein. One of ordinary skill in the art would recognize other variations, modifications, and alternatives. In the diagram, reference number 1 indicates a vessel, 2 a crucible support, 3 a crucible manipulating device, 4 a heater, and 5 a crucible. Quartz crucible 5 in vessel 1 is supported by crucible support 2 made of low-density thermo material to prevent cracking of crucible 5 due to thermal creep during the silicon purification process. Crucible 5 is placed inside heater 4, which radiates heat and produces a thermal field in vessel 1 to melt the silicon raw material in crucible 5, thereby producing silicon melt. The silicon melt absorbs the heat radiated from heater 4 and dissipates heat from its surface or propagates heat to a growing ingot (not shown) via the solidus-liquidus interface and dissipates heat from the ingot surface, producing a silicon growing phenomenon. Crucible manipulating device 3 shifts crucible 5 up or down to assist the growing of the silicon. This is because, during silicon growth, the ingot slowly rotates upwards while the silicon melt surface descends, in order to keep a constant level of the liquid surface as well as to maintain the heating of the silicon material at the solidus-liquidus interface; crucible 5 has to be slowly raised to ensure stability of the silicon growing process.

It should be noted that in order to avoid oxidation of silicon at high temperature, the vessel is usually operated in a inert argon (Ar) gas atmosphere, wherein Ar gas can be fed through the top of the vessel to facilitate purification through reaction of Ar damped gas and the silicon melt.

In a preferred embodiment, the present system and method use a cover gas or pressing gas to enclose a substantial portion of the melted material within the crucible. That is, the crucible is subject to a cover gas to maintain the melted material within the crucible. In a preferred embodiment, the crucible is subject to an argon containing cover gas or other suitable inert gas or gases to maintain the melted material within the crucible. Preferably, the cover gas is suitable to maintain the melted material free from oxidation or other undesirable conditions.

The cover gas is provided within a chamber and/or housing enclosing the crucible. Of course, there can be other variations, modifications, and alternatives.

Figure 2:
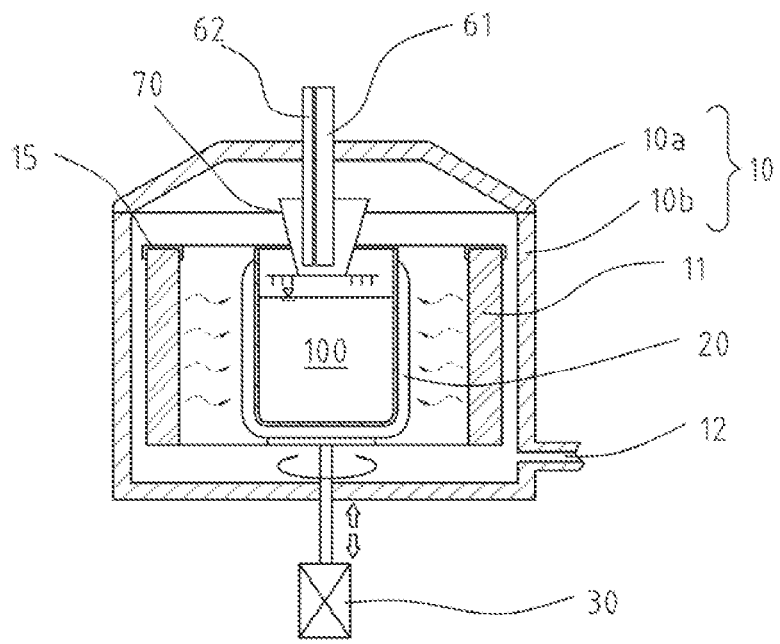
FIG. 2 is a cross-sectional diagram depicting a first embodiment of a modified apparatus of the present invention.

FIG. 2 is a diagram depicting a first embodiment of a metallurgical silicon purification apparatus modified from a conventional crystal puller. This diagram is merely an example, which should not unduly limit the scope of the claims herein. One of ordinary skill in the art would recognize other variations, modifications, and alternatives. In the diagram, reference numeral 10 indicates a vessel, 10*a* the upper portion of the vessel, 10*b* the vessel body, 11 a heater, 12 a decompression tube, 15 an exhaustion passage controlling cap, 20 a crucible, 30 a crucible manipulating device, 61 a chemical and gas supply tube, 62 a high-pressure gas supplying tube, 70 a gas flow guiding element, and 100 a silicon melt.

Vessel 10 consists of upper portion 10*a* and vessel body 10*b*. Above the surface of silicon melt 100 is an independent injecting device consisting of a chemical and gas supply tube 61 and a high-pressure gas supply tube 62. Through supply tube 61, chemicals and gases required for purification, such as soluble compounds of calcium (Ca), silicon (Si) and magnesium (Mg), hydrogen ($H_2$) gas or oxygen ($O_2$) gas, are delivered to the surface of the silicon melt 100. Meanwhile, through high-pressure gas supply tube 62, high-pressure, damped gas mixtures, such as water steam ($H_2O$) or Ar gas, are delivered to the center of the surface of the silicon melt 100 via the high-pressure jet flow, thereby forming a dimple 90 at the surface of silicon melt 100 (see FIG. 9), and in conjunction with a temperature gradient within silicon melt 100 in crucible 20, heat circulation and/or mass convection can be achieved. The jet flow not only facilitates mixing of silicon melt 100 in crucible 20, but also increases the contact areas between the chemicals/gases and silicon melt 100, thus improving the efficiency of the purification process.

In addition, guiding element 70 is provided above silicon melt 100 in crucible 20 at an appropriate location and distance with respect to crucible 20 and supplying tubes 61 and 62. Through guiding element 70, hot gas rising from the surface of silicon melt 100 is guided back to the surface of silicon melt 100, allowing effective contact of the damped gas with silicon melt 100, thus increasing the efficiency of the purification process. Guiding element 70 is further discussed below.

In a preferred embodiment, the system includes guiding element along with a carrier gas configured to cause a portion of evaporated melted material to return to the melted material. In a specific embodiment, the carrier gas can be argon or other inert gas, which is suitable to return any evaporated melted material consisting of silicon entities back into the melted material. In a specific embodiment, the system includes a plurality of surface regions configured to cause a substantial portion of a phosphorus species to be exhausted while returning a substantial portion of silicon species into the melted material. Preferably, the surface regions comprise a plurality of fin regions configured to cause a substantial portion of a phosphorus species to be exhausted while returning a substantial portion of silicon species into the melted material. Of course, there can be other variations, modifications, and alternatives.

In addition, in order to prevent oxidation of the silicon at high temperature and superheating of the silicon melt, the degree of vacuum inside vessel 10 is changed to accommodate evaporating conditions for various impurities contained in the raw silicon, so as to ensure a safe metallurgical silicon purification process. Specifically, a vacuum pump (not shown) and a gas flow valve (not shown) can be used to control the gas and gas flow in vessel 10, wherein the pump regulates pressure via decompression tube 12, which avoids any danger caused by pressure rising due to a constant supply of water steam (purifying material), thereby providing safe and stable metallurgical silicon purification process conditions.

Figure 3:
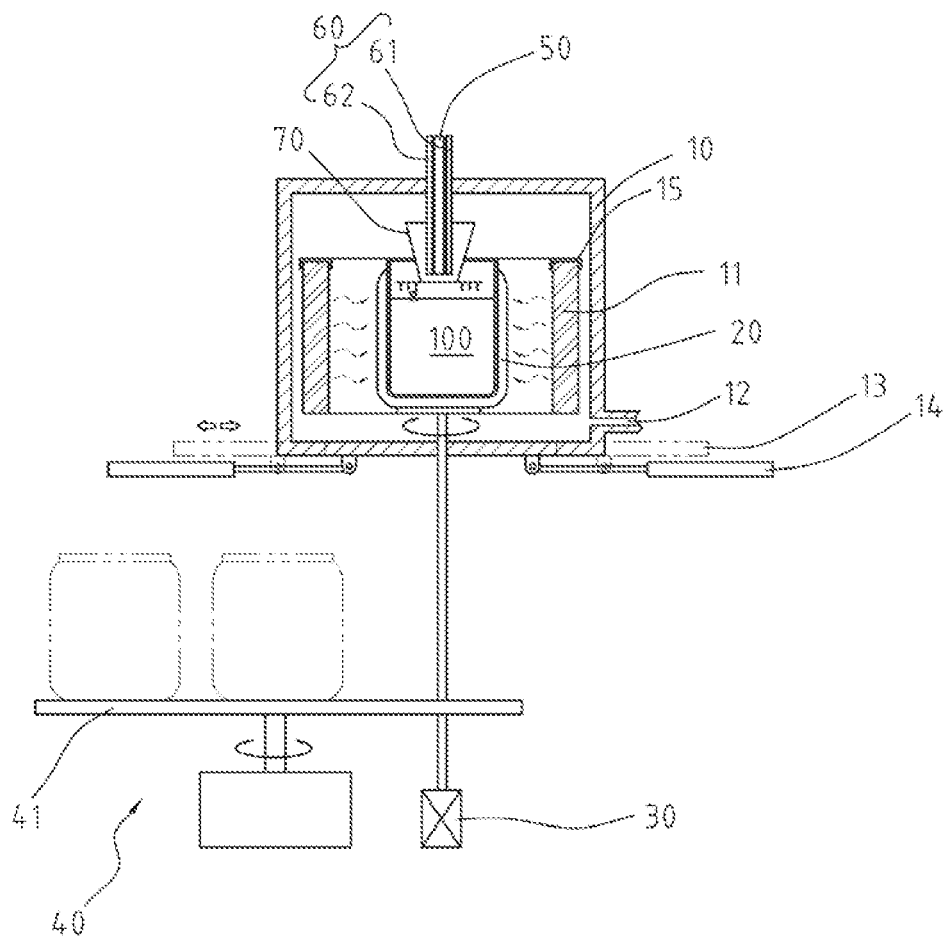
FIG. 3 is a cross-sectional diagram depicting a second embodiment of a modified apparatus of the present invention for easy transportation of a crucible.
Figure 4:
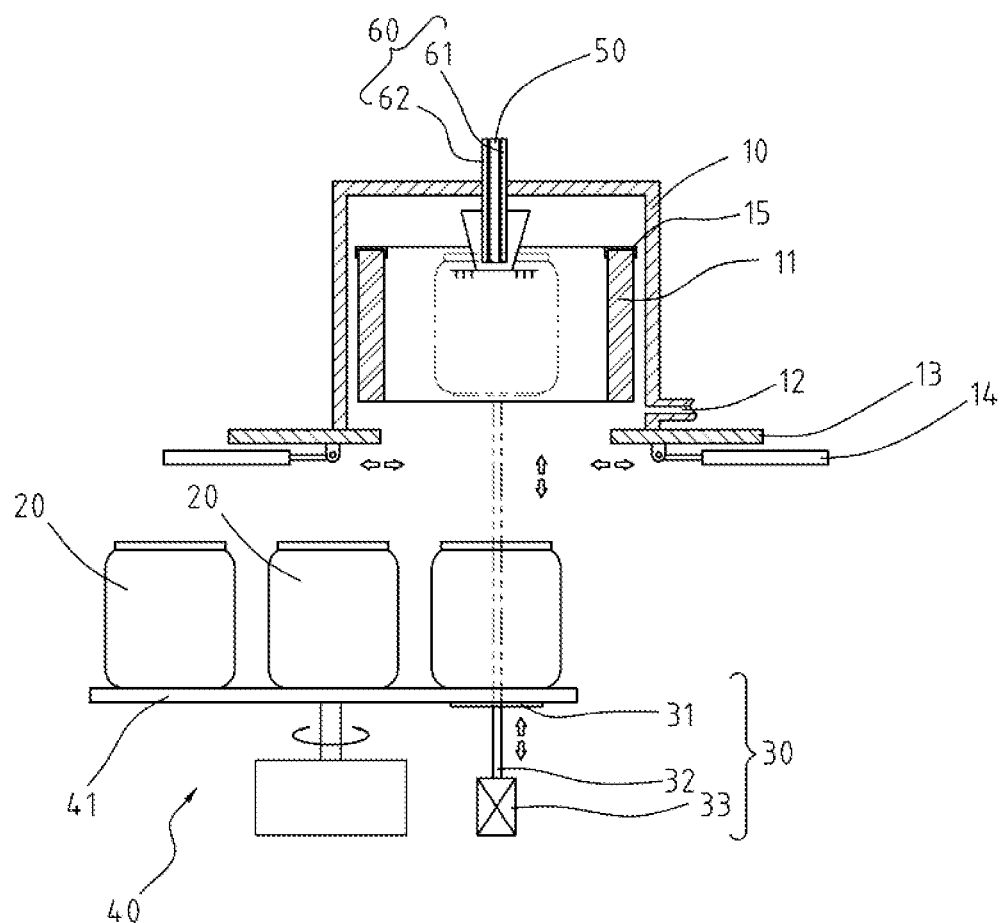
FIG. 4 is a cross-sectional diagram depicting inserting/removing the crucible into/from the vessel of FIG. 3.

FIGS. 3 and 4 are diagrams depicting a second embodiment of the metallurgical silicon purification apparatus modified from the conventional puller. In the diagram, reference numeral 10 indicates a vessel, 11 a heater, 12 a decompression tube, 13 a set of valves and/or port or load locks, 14 a set of valve operating arms, 15 an exhaustion passage controlling cap, 20 a crucible, 30 a crucible manipulating device, 31 a crucible manipulating device base, 32 a crucible manipulating device shifting shaft, 33 a crucible manipulating device motor, 40 a crucible transporting device, 41 a crucible conveyer belt, 50 a plasma arc heater, 60 a purifying material supplying system, 61 a chemical and gas supply tube, 62 a high-pressure gas supply tube, 70 a gas flow guiding element, and 100 a silicon melt.

Above the surface of silicon melt 100 is an independent injecting device consisting of chemical and gas supply tube 61 and high-pressure gas supply tube 62. Through supply tube 61, chemicals and gases required for purification, such as soluble compounds of calcium (Ca), silicon (Si) and magnesium (Mg), hydrogen ($H_2$) gas or oxygen ($O_2$) gas, are provided to the surface of silicon melt 100. Meanwhile, through high-pressure gas supplying tube 62, high-pressure damped gas mixtures, such as water steam ($H_2O$) or Ar gas, are provided to the center of the surface of silicon melt 100 via the high-pressure jet flow, thereby forming a dimple 90 at the surface of silicon melt 100 (see FIG. 9), which, in conjunction with the temperature gradient within silicon melt 100 in crucible 20, allows heat circulation and/or convection to be achieved. The jet flow not only facilitates mixing of silicon melt 100 in crucible 20, but also expands the contact areas between the chemicals/gases and silicon melt 100, thus improving the efficiency of the purification process. In addition, plasma arc heater 50 is provided above silicon melt 100. The plasma arc heater 50, forming an independent injecting device in conjunction with purifying material supplying system 60, intermittently and locally emits the plasma toward the surface of silicon melt 100 in crucible 20. This creates a reproducible temperature profile across silicon melt 100. Meanwhile, oxygen ($O_2$) gas from high-pressure gas supplying tube 62 is provided toward the burning hydrogen ($H_2$) supplied by plasma arc heater 50 and into the center of the surface of silicon melt 100 in crucible 20, forming water steam ($H_2O$) via hydrogen burning. The water steam is further propagated into silicon melt 100 through the force of the high-pressure oxygen jet flow, effectively providing water steam required for silicon purification to silicon melt 100.

In addition, in the second embodiment, a crucible manipulating device 30 is provided underneath vessel 10 to provide for raising/lowering, rotating and horizontal shifting. Crucible manipulating device 30 includes crucible manipulating device base 31, crucible manipulating device shifting shaft 32, and crucible manipulating device motor 33. Since the present invention does not need a seed ingot for silicon growth, during the purifying process, the surface level of silicon melt 100 in crucible 20 does not descend. Through crucible manipulating device 30, not only can the vertical movements of crucible 20 inside vessel 10 be controlled in order to install or remove crucible 20, but crucible 20 at the end of the silicon purification process can be transported in cooperation with crucible transporting device 40 and crucible conveyer belt 41. Moreover, the vertical movements and the rotation of crucible 20 can be controlled by crucible manipulating device 30, so as to adjust the solidus-liquidus interface of silicon melt 100 with respect to the location of heater 11, so as to achieve one-directional cooling purification associated with Segregation Theory, without the need for temperature segregation coefficient management of the concentration of remaining impurities in silicon melt 100 with respect to the solidus-liquidus line. In addition to adjusting the solidus-liquidus interface of silicon melt 100 with respect to the location of heater 11 for silicon purification by crucible manipulating device 30, the distance between crucible 20 and guiding element 70 can also be controlled by crucible manipulating device 30, so that damped gases from the surface can be effectively directed back to silicon melt 100 to facilitate the supply of water for purification. Meanwhile, by controlling the distance, the form of dimple 90 (see FIG. 9) on the surface of silicon melt 100 caused by direct impact of the jet flow from the injecting device can be controlled. Furthermore, referring to FIGS. 3 and 4, besides the crucible manipulating device 30, a set of valves 13 that can be horizontally closed or opened, and which are controlled by a set of valve operating arms 14 capable of horizontal shifting, is provided beneath vessel 10. When installing/removing crucible 20 into/from vessel 10, the valve 13 is opened and closed horizontally to reduce the reaction of carbon products in the vessel with oxygen, which would affect the purification response of silicon melt 100.

In addition, guiding element 70 is provided above silicon melt 100 in crucible 20 at an appropriate location with respect to crucible 20 and supply tubes 61 and 62. Through guiding element 70, hot air flow from the purifying gas flow provided to the surface of silicon melt 100 is guided back to the surface of silicon melt 100, allowing effective contact of the damped gas with silicon melt 100, thus increasing the efficiency of the purification process.

In addition, in order to prevent oxidation of the silicon at high temperature, vessel 10 has to be kept at a certain degree of vacuum. Specifically, a vacuum pump (not shown) and a gas flow valve (not shown) can be used to control the gas and gas flow in vessel 10, wherein the pump regulates pressure via decompression tube 12, which avoids any danger caused by pressure rising due to constant supply of water steam (purifying material), therefore providing safe and stable metallurgical silicon purification process conditions.

Figure 5:
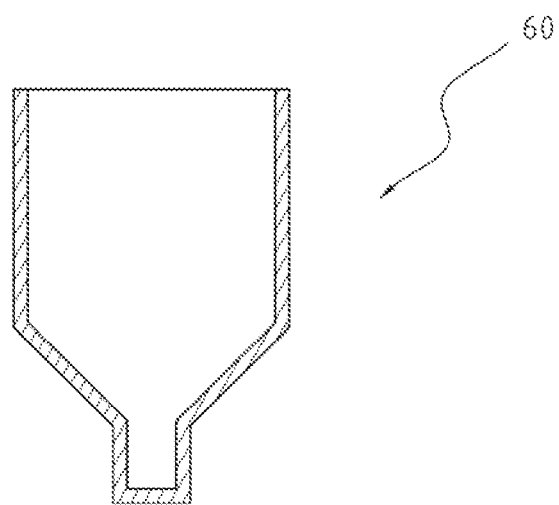
FIG. 5 is a cross-sectional diagram depicting the end of a tube for a purifying material supplying system of the present invention.

FIG. 5 is a schematic diagram depicting the tube end of purifying material supply system 60 of the present invention described in FIGS. 2, 3, and 4. For the purpose of supplying high pressure damped gas mixtures so as to form a dimple 90 on the center of the surface of silicon melt 100 that expands the contact area and contact time of the purifying materials with silicon melt 100, and enhancing the mixing of silicon melt 100 in crucible 20 for purification, the tube of purifying material supplying system 60 is designed to have a converging cone shape to increase the injecting pressure and flow rate. The material of this cone-shaped tube should be carefully selected to reduce loss when used for supplying chemicals and gases and as a heat source. To this end, the tube is preferably coated by a material such as quartz.

Figure 6:
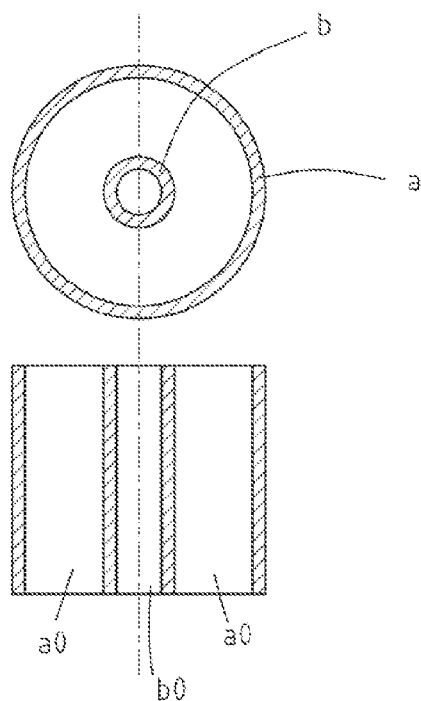
FIG. 6 is a cross-sectional diagram depicting a plurality of tubes for a purifying material supplying system of the present invention.

FIG. 6 is a schematic diagram depicting an implementation of independent purifying material supplying system 60 of the present invention consisting of chemical and gas supply tube 61 and high-pressure gas supply tube 62 described in FIGS. 2, 3, and 4. FIG. 6 shows a design of concentric double tubes for providing different combinations of purifying materials (e.g., chemicals, gases, and soluble chemicals), including an outer tube a and an inner tube b. Reference letters/numerals a0 and b0 indicate the outlets of outer tube a and inner tube b, respectively. However, the present invention is not limited to these, but can have three or more tubes, as long as they provide different combinations of purifying materials to the surface of the silicon melt.

Figure 6A:
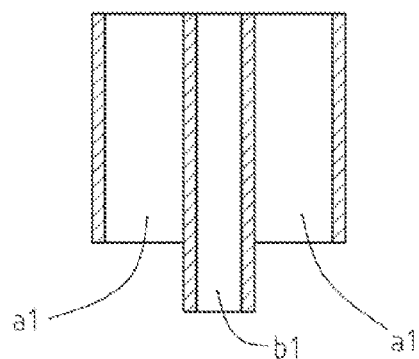
Figure 6B:
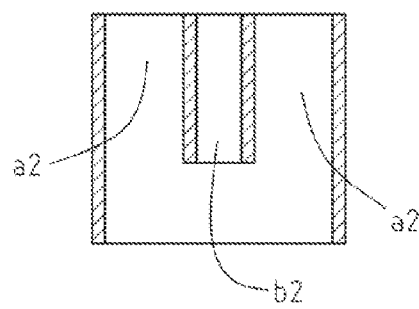

FIGS. 6(A) and 6(B) are cross-sectional diagrams depicting implementations of multi-tube designs for supplying purifying materials to the surface of silicon melt 100. As shown in FIG. 6(A), the inner tube protrudes from the outer tube, wherein outlet b1 of the inner tube supplies high-pressure damped gases (e.g., Ar) and/or water, while outlet a1 of the outer tube supplies Ar gas. Through such a design, the high-pressure damped gases and/or water may pass through the surface of the silicon melt via the center of dimple 90 (see FIG. 9), effectively delivering damped gases and/or water required for silicon purification into silicon melt 100 in crucible 20. As shown in FIG. 6(B), the inner tube is shorter than the outer tube, and outlet a2 of the outer tube supplies $H_2$ gas for reacting with $O_2$ to form water, while outlet b2 of the inner tube supplies $O_2$ necessary for forming water when reacting with the burning hydrogen gas. Since the inner tube is shorter than the outer tube, $H_2$ provided by outlet a2 of the outer tube can reach the surface of silicon melt 100 through diffusion and burn due to high temperature, and if $O_2$ is provided from outlet b2 of the inner tube b2 towards the center of the burning $H_2$, water steam is produced. This water steam and a portion of the non-reacted free oxygen are effectively brought to the surface of the silicon melt 100 for purification.

Figure 7:
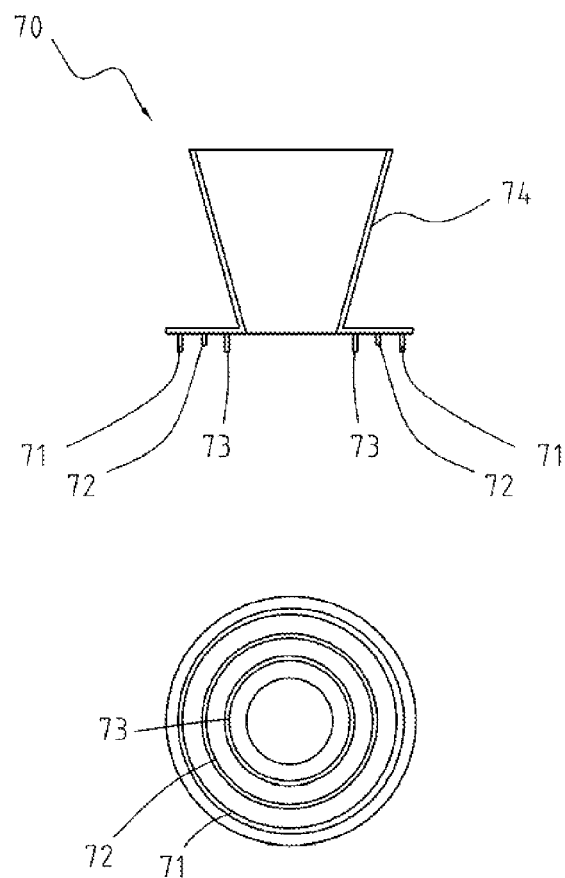
FIG. 7 is a cross-sectional diagram depicting a guiding element of the present invention.

FIG. 7 is a schematic diagram depicting a design for gas flow guiding element 70 of the present invention. As described above, guiding element 70 is positioned at an appropriate distance and location with respect to silicon melt 100 in crucible 20, taking into consideration plasma arc heater 50 and purifying material supplying system 60. The guiding element 70 redirects rising hot air back to the surface of silicon melt 100, allowing effective contact of the damped gas with silicon melt 100, thus increasing the efficiency of the purification process. Guiding element 70 includes a body 74 and several fins 71, 72 and 73 extending from the lower edge of body 74.

Figure 8:
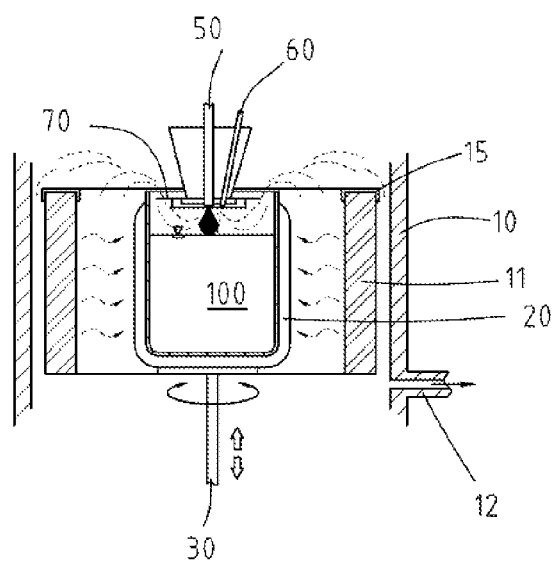
FIG. 8 is a cross-sectional diagram depicting gas flow of a plasma arc heater in an apparatus of the present invention.

FIG. 8 is a schematic diagram depicting the flow of the rising hot and damped gases. When plasma arc heater 50 irradiates silicon melt 100 in crucible 20, the temperature of silicon melt 100 rises and generates a rising hot and damped gas flow (indicated by dashed lines), which diffuses above the surface of silicon melt 100 in crucible 20.

Figure 10:
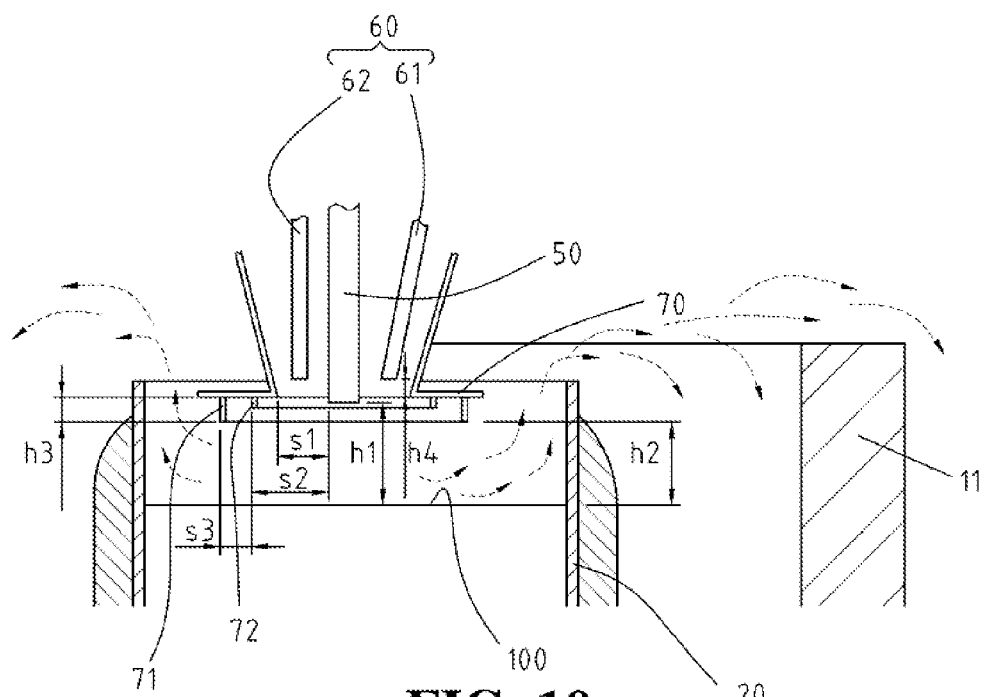
FIG. 10 is a schematic diagram illustrating the positional relationship of the injecting device and guiding element inside an apparatus of the present invention.

Also, FIG. 10 shows the distances and locations of guiding element 70 with respect to crucible 20 and the surface of silicon melt 100, and their relative relationship with the rising hot and damped gas flow. The following distances and locations are obtained from actual experiments performed by the inventors, which are not to be construed as limiting the present invention.

As shown in FIG. 10, reference numeral 11 indicates a heater, 50 a plasma arc heater, 60 a purifying material supply system, 61 a chemical and gas supply tube, 62 a high-pressure gas supply tube, 70 a gas flow guiding element, 71 and 72 fins, 20 a crucible, 100 a silicon melt, h1 the distance between the plasma arc heater outlet and the surface of the silicon melt, h2 the distance between fin 71 of guiding element 70 and the surface of silicon melt 100, h3 the length of longest fin 71, h4 the distance from gas supplying tube 61 to the plasma arc heater 50 outlet, s1 the distance between the bore of guiding element 70 to the plasma arc heater 50, s2 the distance from the plasma arc heater 50 to inner fin 72, and s3 the interval between fins 71 and 72. Distance h4 is dependent on the jet force of purifying material supplying system 60 and the supplied amount (V) of the gas flow through guiding element 70.

Based on the experimental results, when the supplied amount (V) is 100~800 L/hour, distance h4 is 10 cm, which is the maximum value.

For distance h1, it can be understood from the experimental results that when distance h1 reaches 5 cm, the results are best. A suitable range is from 1 cm to 18 cm.

For distance s1, it can be understood from the experimental results that this distance s1 should be as short as possible to accelerate the rate at which the gas flows through. From the experimental results, in the case that the chemical and gas supplying tube 61 and the high-pressure gas supplying tube 62 are lowered to the level of the lower edge of guiding element 70, distance s1 is preferably between 1 cm and 6 cm.

Distance s2 is dependent on the pressure of purifying material supplying system 60 and the supplied amount (V) of the gas, i.e., the flow rate of the gas going through that space. From the experimental results, in the case that the supplied amount (V) is 100~800 L/hr, the results are optimum when distance s2 is between 2 cm and 8 cm.

Distances s2 and s3 are also dependent on the number of fins 71 and 72. From the experimental results, when the number of fins is two, the sum of distances s2 and s3 is preferably distance s2 plus 5 mm to 30 mm.

For distance h2, it can be appreciated that, from theory, the smaller the distance, the better the result. But considering the effect of temperature and so on, the distance h2 is preferably between 5 mm and 50 mm.

Distance h3 is related to distance h2 and the position of guiding element 70. From the experimental results, distance h3 is preferably between 5 mm and 30 mm.

For distance h1, in the case that the plasma arc heater 50 is used in the experiment, 5 cm is suitable. However, the use of plasma arc heater 50 is potentially dangerous, so a reasonably good result is obtainable if distance h1 is between 1 cm and 18 cm.

Figure 9:
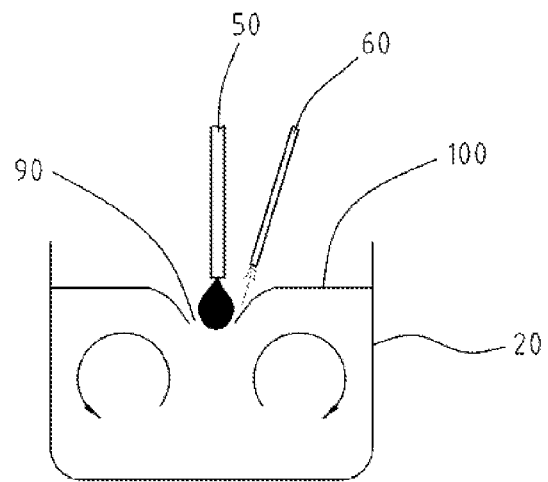
FIG. 9 is a schematic diagram illustrating a dimple and circulation of a silicon melt caused by a plasma arc heater and high-pressure gases of the present invention.

Furthermore, FIG. 9 is a schematic diagram depicting dimple 90 formed by irradiation by the plasma arc heater 50 and/or circulation in silicon melt 100 induced by purifying material supplying system 60. When plasma arc heater 50 emits plasma and purifying material supply system 60 supplies high-pressure and high-speed jet flow to the center of the surface of silicon melt 100, a dimple 90 is formed thereon, and as plasma is irradiating the dimple 90, the high-temperature area on the surface of silicon melt 100 is expanded. In conjunction with the temperature profile across silicon melt 100 in crucible 20 formed by the plasma arc heater 50, a greater inversion radius of heat circulation in silicon melt 100 is produced. The heat circulation redistributes the impurities within silicon melt 100 more evenly. The jet flow facilitates mixing of silicon melt 100 in crucible 20, and also expands the contact area between silicon melt 100 and the purifying materials (e.g., gases and chemicals), thereby increasing purification efficiency. In addition, the plasma from plasma arc heater 50 can be applied intermittently to prevent overheating of overall silicon melt 100 and to maintain an appropriate temperature profile across silicon melt 100 in crucible 20.

Figure 11A:
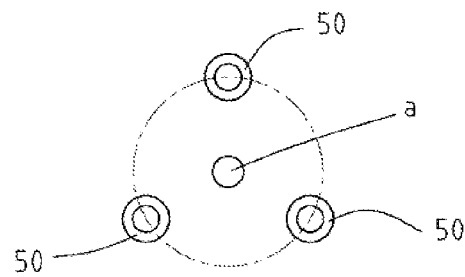
FIG. 11 is a schematic diagram illustrating arrangements of a plurality of arc heaters of the present invention.
Figure 11B:
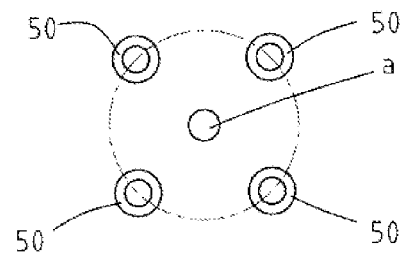
Figure 11C:
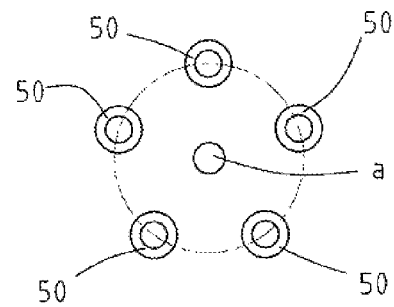
Figure 11D:
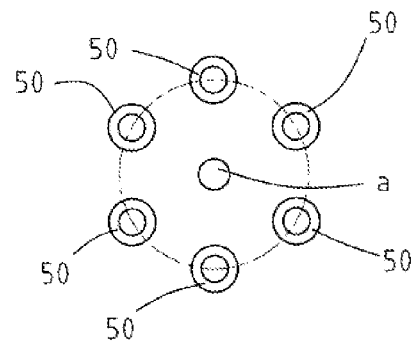
Figure 12:
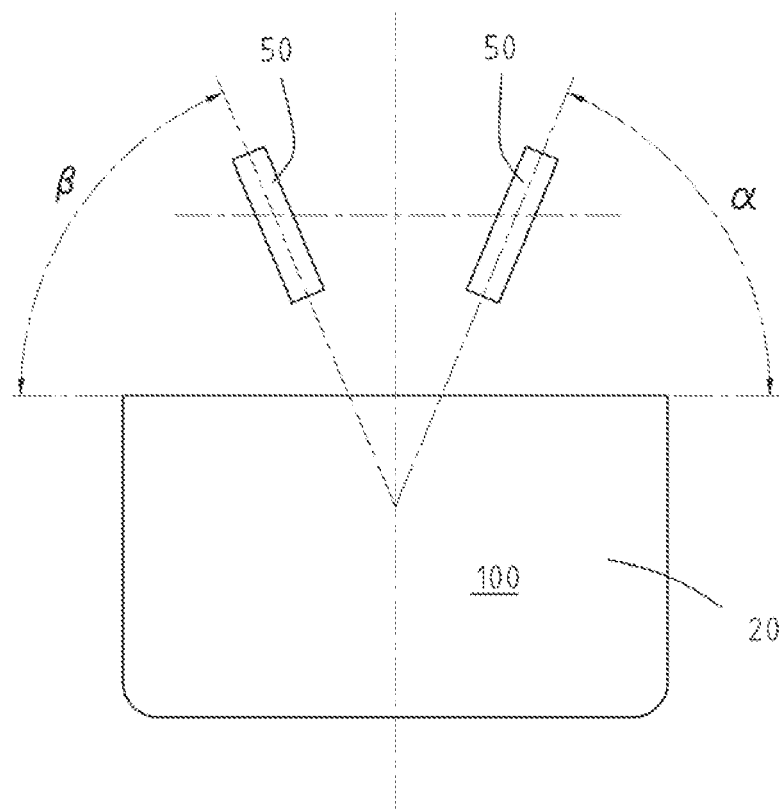
FIG. 12 is a schematic diagram illustrating positions of a plurality of injecting device with respect to a crucible of the present invention.

FIGS. 11, 12, and 13 are schematic diagrams depicting the irradiation of the surface of silicon melt 100 in crucible 20 using various sets of plasma arc heaters 50.

When a large amount of raw silicon has to be purified, a plurality of plasma arc heaters 50 can be used to generate irradiation of higher energy. However, when a plurality of plasma arc heaters 50 is used to irradiate the center of the surface of silicon melt 100 at the same time, it may overheat and damage the purifying apparatus, for example, overheat and damage the bottom of crucible 20. In order to overcome such a problem, the present invention arranges a plurality of plasma arc heaters 50 around the center of the surface of silicon melt 100 at equal angular distances. For example, FIG. 11(A) is a schematic diagram depicting three plasma arc heaters 50 surrounding center a of the surface; FIG. 11(B) four plasma arc heaters 50; FIG. 11(C) five plasma arc heaters 50; and FIG. 11(D) six plasma arc heaters 50. In the above combinations of plasma arc heaters 50, the irradiation from the plurality of plasma arc heaters 50 is required to focus somewhere below the surface of silicon melt 100 to avoid overheating of crucible 20, while ensuring good heat circulation of silicon melt 100.

Figure 13A:
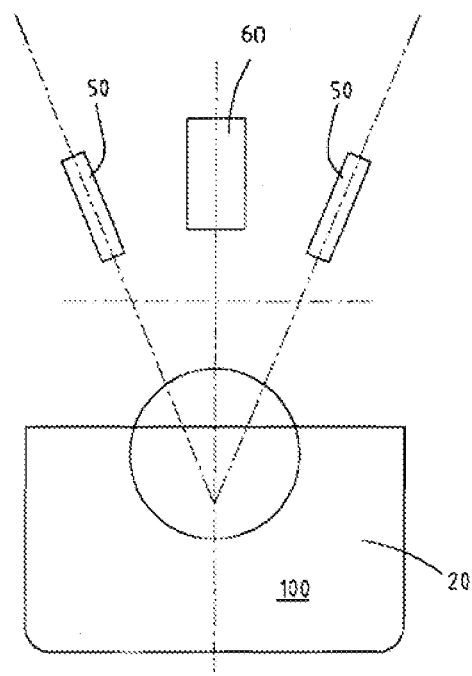
FIG. 13 is a schematic diagram illustrating a dimple region on a center of the surface of a silicon melt caused by a plurality of plasma arc heaters of the present invention.
Figure 13B:
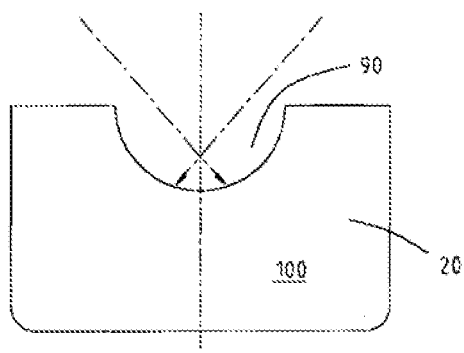

Referring to FIG. 12, plasma arc heaters 50 are arranged at certain angles with respect to the surface of silicon melt 100. Different angles produce different forms of dimple 90. The angle should be smaller than or equal to 90° ($\leq 90°$). As shown in FIG. 12, plasma arc heaters are arranged at angles $\alpha$ and $\beta$ above the surface of silicon melt 100, which determines the irradiation focus of the plasma. Normally, the deeper the irradiation, the greater the angles $\alpha$ and $\beta$. In addition, the temperature profile of silicon melt 100 in crucible 20 will also change in accordance with the change in angles of plasma arc heaters 50. The dimples 90 that are formed will be different, which implies that varying the irradiation angles changes the evaporation rate of silicon melt 100. As shown in FIGS. 13(A) and 13(B), different dimples 90 are formed when plasma arc heaters 50 at different angles irradiate the surface of silicon melt 100. Further, it should be noted that, by controlling the positions of plasma arc heaters 50 using crucible manipulating device 30, various positions and temperatures of optimum plasma irradiation can be obtained, and the form of the dimples 90 depends on the irradiation angles $\alpha$ and $\beta$ of plasma arc heaters 50.

The preferred embodiments of the present invention are described in detail below with respect to the aforementioned drawings.

The present invention addresses the issue of how to efficiently mix purifying materials (e.g., chemicals and gases) into metallurgical silicon to be purified.

The melting temperature of metallurgical silicon is about 1425° C. There is the possibility that the purifying materials will be nebulized and exhausted due to circulation of radiation heat of the silicon melt before reaching the silicon melt.

In view of this, the following approach is proposed by conventional techniques.

Purifying materials are blown from the bottom of the crucible. This approach may work in theory, but in practice, the following problems occur. A pressure that is sufficient to overcome the viscosity of liquid silicon melt is required. In addition, in order to avoid backflow, blowing has to be done at a level higher than the surface of the silicon melt, which lengthens the blowing tube, therefore requiring an even higher pressure. In the case that the pressure is temporarily decreased, silicon melt backflows into the tube and solidifies at a low-temperature region, which may result in breaking of the tube due to increased mechanical pressure. Thus, the tube has to be maintained at a certain temperature.

This approach thus has the following problems:
a) Addition of impurities cannot be avoided, i.e., product has a low purity;
b) Expensive apparatus;
c) Safety issue.

Furthermore, although silicon melt can be mixed and stirred by device of mechanical stirring, considering the high-temperature and viscous environment, the material and mechanical strength requirements of the stirring shaft render no easy solution.

Another approach, the so-called weathering approach, is also used for purification.

This method of purification is commonly used in making iron and aluminum, and is proven to be effective.

This method removes impurities and additives (e.g., magnesium oxide and calcium) by vitrification.

The vitrified impurities float on the surface of the purified metal, and after cooling, they can be removed from the surface by mechanical device to obtain a purified product.

This approach has limitations in terms of the purity level of the final product. However, if this approach is simultaneously adopted with the apparatus of the present invention, the purity can be increased.

The present invention is related to the development of a purification apparatus that allows effective mixing of purifying materials into silicon melt.

It should be understood that the metallurgical silicon purifying apparatus proposed by the present invention can be obtained by modifying existing single crystal silicon puller apparatus. The existing apparatus usually includes a vessel, a crucible, a crucible support and a heater. By implementing at least one of the following device in the existing apparatus, purification of metallurgical silicon is performed using one, some or all of the device simultaneously:

an independent injecting device provided above the crucible for providing plasma, gases and chemicals required for purifying in a high-speed jet flow to the surface of a silicon melt, and forming a dimple on the surface of the silicon melt by its supply tubes, and in cooperation with a temperature profile across the silicon melt, facilitating heat circulation and increasing the circulation inversion radius, as well as increasing the contact area between the purifying gases and chemicals and the silicon melt, thereby increasing purification efficiency;

a guiding element with fins thereon provided above the silicon melt in the crucible, at an appropriate location with respect to the crucible and the supply tubes for the purifying gases and chemicals, for guiding damped gas flow rising from the surface of the silicon melt back to the surface of the silicon melt, so that the damped gases effectively contact the silicon melt, wherein the distance between the guiding element and the surface of the silicon melt, the distance between the fins and the silicon melt, and the distance between the interior circumference of the crucible and the fins are critical;

a manipulating device provided underneath the vessel for vertically and horizontally shifting and rotating the crucible with respect to the heater to adjust the solidus-liquidus interface to obtain one-directional cooling purification without the need for temperature segregation coefficient management of the concentration of remaining impurities in the silicon melt with respect to the solidus-liquidus line, and allowing effective backflow of the damped gases and controlling the form of the dimple created by the jet flow from the injecting device on the surface of the silicon melt by adjusting the distance between the crucible and the guiding element, wherein a set of valves capable of horizontal motion is further provided in the manipulating device in order to reduce reactions of carbon parts with oxygen when the crucible is taken out or inserted into the vessel by opening/closing the valves; and a vacuum pump provided to regulate the pressure or degree of vacuum inside the vessel and to accommodate evaporating conditions for various impurities.

In summary, the present invention proposes an apparatus, obtained by modifying an existing apparatus, for purifying metallurgical silicon for use as raw silicon in manufacturing solar cells to replace the traditional Siemens method.

Depending upon embodiment, one or more of the following aspects are included.

1. An apparatus for purifying metallurgical silicon obtained by modifying an existing single crystal silicon puller apparatus including a vessel, a crucible, a crucible support and a heater, with the addition of one, some, or all of the following devices for the purification of metallurgical silicon:

an independent injecting device provided above the crucible for providing plasma, gases and chemicals required for purifying in a high-speed jet flow to the surface of a silicon melt, and forming a dimple on the surface of the silicon melt by its specially designed supplying tubes;

a guiding element with fins thereon provided above the silicon melt in the crucible at an appropriate location and distances (h1) (h2) (h3) (h4) (s1) (s2) (s3) with respect to the crucible and the surface of the silicon melt for guiding damped gas flow rising from the surface of the silicon melt (as a result of heating at the surface of the silicon melt) back to the surface of the silicon melt, so that the damped gases effectively contact the silicon melt;

a manipulating device provided underneath the vessel for vertically and horizontally shifting and rotating the crucible with respect to the heater to adjust the solidus-liquidus interface to obtain purification and to further control the relative position of the crucible with respect to the guiding element and the injecting device above to obtain optimum purification efficiency; and a vacuum pump provided to regulate the pressure or degree of vacuum inside the vessel and to accommodate evaporating conditions for various impurities.

2. The apparatus of claim 1, wherein the injecting device includes an independent chemical and gas supply tube for supplying chemicals, gases and soluble gases to the center of the surface of the silicon melt for purification.

3. The apparatus of claim 1, wherein the injecting device includes an independent high pressure gas supply tube for supplying a high-pressure damped gas mixture to the center of the surface of the silicon melt for purification.

4. The apparatus of claim 1, wherein the injecting device includes an independent purifying material supply system including a chemical and gas supplying tube and a high-pressure gas supply tube for supplying chemicals, gases and soluble gases and a high-pressure damped gas mixture, respectively, to the center of the surface of the silicon melt for purification.

5. The apparatus of claim 4, wherein the end of the tubes in the purifying material supply system have a converging cone shape for increasing jet pressure and flow rate.

6. The apparatus of claim 5, wherein the material of the tubes includes quartz coating material thereon.

7. The apparatus of claim 4, wherein the purifying material supply system has a concentric multi-tube design for supplying at least one of chemicals, gases, soluble chemicals, damped gases and water.

8. The apparatus of claim 7, wherein the concentric multiple tubes include an inner tube longer than an outer tube.

9. The apparatus of claim 8, wherein the outlet of the inner tube supplies at least one of a high-pressure damped gas and water, and the outlet of the outer tube supplies argon gas.

10. The apparatus of claim 7, wherein the concentric multiple tubes include an inner tube shorter than an outer tube.

11. The apparatus of claim 10, wherein the outlet of the outer tube supplies hydrogen gas for reacting with oxygen to form water, and the outlet of the inner tube supplies oxygen for reacting with burning hydrogen to form water.

12. The apparatus of claim 1, wherein the injecting device include at least one plasma arc heater for irradiating the surface of the silicon melt and injecting chemicals and gases required for purification.

13. The apparatus of claim 12, wherein plasma is irradiated intermittently and locally on the surface of the silicon melt to create a reproducible temperature gradient in the silicon melt.

14. The apparatus of claim 12, wherein a plurality of plasma arc heaters are arranged around the center of the surface of the silicon melt at equal angular distances, and the plasma arc heaters are tilted at predetermined angles with respect to the plane of the silicon melt, so the irradiation is focused at a point below the silicon melt surface to form dimples of different forms on the surface of the silicon melt.

15. The apparatus of claim 14, wherein the tilting angles of the plasma arc heaters with respect to the plane of the silicon melt are smaller than or equal to (90° ($\leqq 90°$)).

16. The apparatus of claim 1, wherein the manipulating device includes a crucible manipulating device base, a crucible manipulating device shifting shaft, and a crucible manipulating device motor for controlling the vertical movements of the crucible inside the vessel in order to install or remove the crucible and for controlling the vertical movements and rotation of the crucible in order to move the crucible with respect to the heater, so as to adjust the solidus-liquidus interface for one-directional cooling purification, and in order to control the distance between the surface of the silicon melt and the guiding element above, so that damped gases generated from the surface can be effectively directed back to the silicon melt to facilitate the supply of water for purification, and also, by controlling this distance, to control the form of the dimple created on the surface of the silicon melt caused by direct impact of the jet flow from the injecting device.

17. The apparatus of claim 16, wherein the manipulating device further includes a crucible transporting device and a crucible conveyer belt for transporting the crucible at the end of the purification process.

18. The apparatus of claim 1, wherein the manipulating device further includes a set of valves provided beneath the vessel that can be horizontally closed or opened by a set of valve operating arms, so in the case of installing or removing the crucible into or from the vessel, the valves are opened and closed horizontally to reduce the reaction of carbon parts in the vessel with oxygen, which would affect the purification of the silicon melt.

19. The apparatus of claim 1, wherein the guiding element includes a body and at least one fin extending from the lower edge of the body.

20. The apparatus of claim 1, 2, 3, 12 or 19, wherein in the case that the gas flow rate through the guiding element (V) is 100~800 L/hour, the distance (h4) from the gas supplying tube of the injecting device to the outlet of the plasma arc heater is 10 cm, which is the maximum value; the distance (h1) from the outlet of the plasma arc heater to the surface of the silicon melt is in a range between 1 cm and 18 cm, with 5 cm being preferable; the distance (s1) from the plasma arc heater to the bore of the guiding element, in the case that the chemical and gas supply tube and the high pressure gas supply tube are lowered to the level of the guiding element, is preferably between 1 cm and 6 cm; the distance (s2) from the plasma arc heater to an inner fin of the guiding element, which is dependent on the pressure of the injecting device and the supplied amount (V) of the gas, i.e., the flow rate of the gas going through that space, in the case that the supplied amount (V) is 100~800 L/hr, is preferably between 2 cm and 8 cm; the distance (s2) and the distance between fins of the guiding element (s3) are also dependent on the number of fins provided, so that when the number of fins is two, the sum of distances s2 and s3 is preferably distance (s2) plus 5 mm to 30 mm; the distance (h2) from a fin to the surface of the silicon melt is preferably between 5 mm and 50 mm; and the longest fin (h3) in the guiding element is preferably between 5 mm and 30 mm.

21. The apparatus of claim 1, wherein a vacuum pump and a gas flow valve are used to control the gas and gas flow rate in the vessel, with the pump regulating the pressure via a decompression tube to avoid any danger caused by the pressure rising due to constant supply of water steam, to accommodate evaporating conditions for various impurities contained in raw silicon, and to prevent superheating of the silicon melt, thereby ensuring a safe metallurgical silicon purification process.

It is also understood that the examples and embodiments described herein are for illustrative purposes only and that various modifications or changes in light thereof will be suggested to persons skilled in the art and are to be included within the spirit and purview of this application and scope of the appended claims.

Example

Figure 14:
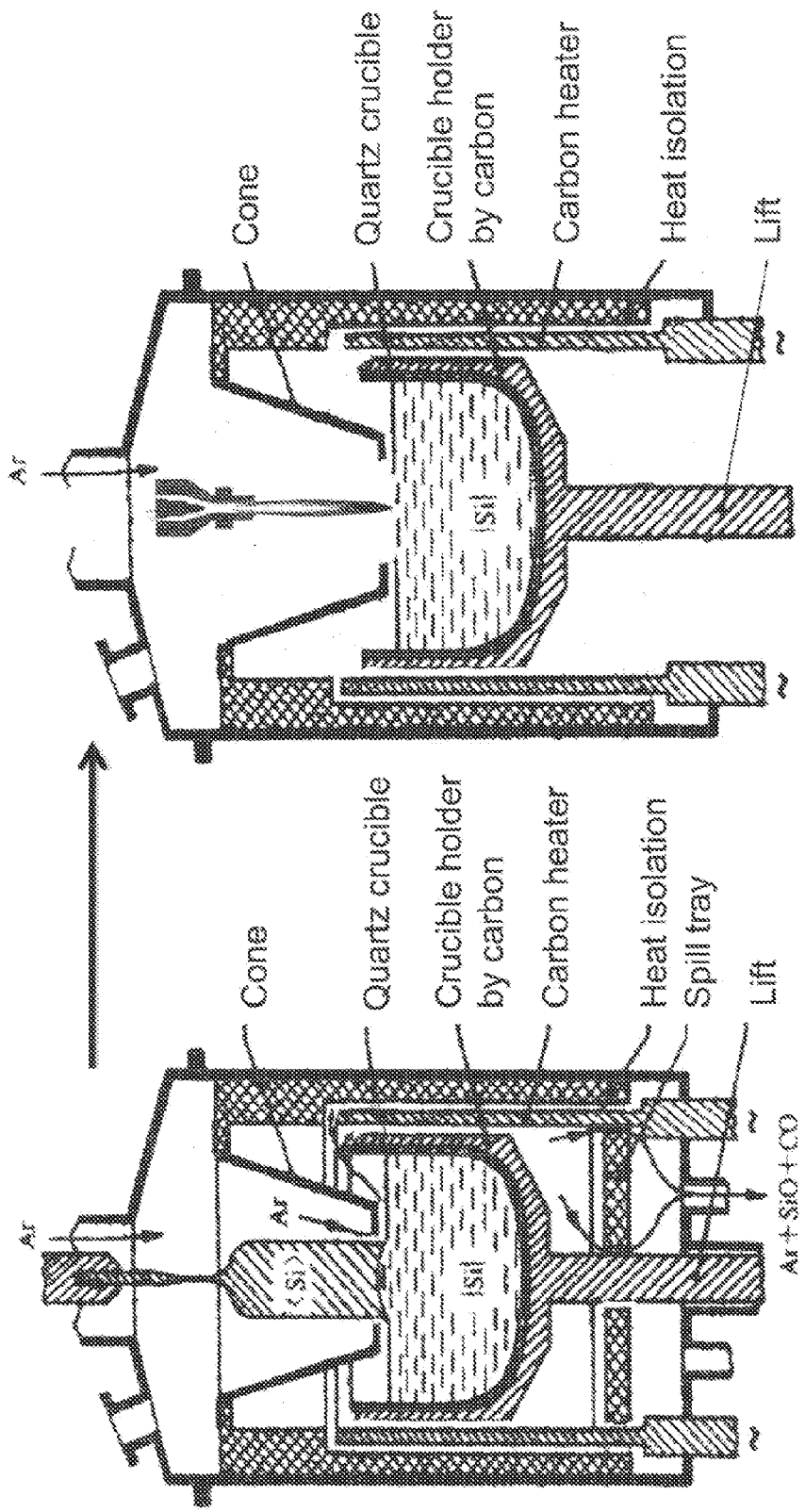
FIG. 14 is a simplified diagram of a pulling apparatus according to an embodiment of the present invention.

To prove the principle and operation of the present invention, we performed certain experiments. We performed the poly-Si purification experiments using several generations of modified conventional single crystal Si ingot pullers. Such pullers included a very small and conventional puller (about 20 Kg Si per charge) to a mid-size puller (about 80 Kg Si per charge). We maintained the crucible apparatus and controls, which were modified to operate in a manner consistent with the present pilot silicon purification apparatus configured for purifying metallurgical silicon. Upon introducing metallurgical silicon, processing such silicon, and purifying the silicon according to the present examples. We achieved purification result of 6N~7N (e.g., 99.9999 to 99.99999 silicon purity), reaching the desired specification suitable for solar cell applications. The present pilot purifier in operation has been modified from a large size conventional puller (about 140 Kg Si per charge). See, for example, FIG. 14. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming high quality silicon material for photovoltaic devices, the method comprising:

transferring a raw silicon material in a crucible having an interior region, the crucible being provided within a vessel, the crucible being made of a quartz material, the quartz material being capable of withstanding a temperature of at least 1400° C.;

subjecting the raw silicon material in the crucible to thermal energy to cause the raw silicon material to be melted into a liquid state, the melted material having an exposed region bounded by the interior region of the crucible;

subjecting an exposed inner region of the melted material to an energy source comprising an arc heater configured above the exposed region and spaced by a gap between the exposed region and a muzzle region of the arc heater to cause formation of a determined temperature profile within a vicinity of an inner region of the exposed melted material while maintaining outer regions of the melted material at a temperature below a melting point of the quartz material of the crucible;

removing one or more impurities from the melted material to form a higher purity silicon material in the crucible;

providing chemicals and gases required for purification and high-pressure damped gas mixtures through an independent injecting device, the independent injecting device having a chemical and gas supply tube and a high-pressure gas supply tube, the chemicals and gases required for purification being provided through the chemical and gas supply tube and the high-pressure damped gas mixtures being provided through the high-pressure gas supply tube;

outputting an inert gas through a nozzle region to cause a dimple region within a vicinity of the center region of the melted material;

providing a cover gas to maintain the melted material within the crucible; and guiding hot gas rising from a surface of the silicon melt through a guiding element configured to cause a portion of evaporated melted material to return to the melted material.

2. A method for forming high quality silicon material for photovoltaic devices, the method comprising:

transferring a raw silicon material in a crucible having an interior region, the crucible being provided within a vessel, the crucible being made of a quartz material, the quartz material being capable of withstanding a temperature of at least 1400° C., subjecting the raw silicon material in the crucible to thermal energy to cause the raw silicon material to be melted into a liquid state, the melted material having an exposed region bounded by the interior region of the crucible;

subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible;

removing one or more impurities from the melted material to form a higher purity silicon material in the crucible;

providing chemicals and gases required for purification and high-pressure damped gas mixtures through an independent injecting device, the independent injecting device having a chemical and gas supply tube and a high-pressure gas supply tube, the chemicals and gases required for purification being provided through the chemical and gas supply tube and the high-pressure damped gas mixtures being provided through the high-pressure gas supply tube;

outputting an inert gas through a nozzle region to cause a dimple region within a vicinity of the center region of the melted material; and providing a cover gas to maintain the melted material within the crucible;

wherein the nozzle region comprises a plurality of nozzles and the inert gas comprises an argon gas characterized by a flow rate suitable to form the dimple region comprising a plurality of recessed regions.

3. The method of claim 1 wherein the nozzle region is coupled to an argon gas source, the nozzle region comprising a ceramic material.

4. The method of claim 1 wherein the dimple region provides an increased surface region for a plume to interact with the melted material; wherein the dimple region has a depth of at least one centimeter.

5. The method of claim 1 wherein the melted material comprises a viscosity of 0.7 Pascal-second.

6. The method of claim 1 wherein the melted material comprises a silicon material and a phosphorus species.

7. The method of claim 1 wherein the melted material comprises a resulting phosphorus species of 0.1 ppm and less in purified silicon.

8. The method of claim 1 wherein the crucible is provided within a vessel and further comprising raising the crucible via a crucible manipulating device within the vessel to keep a constant level of the liquid surface and to maintain heating of the silicon material at the solidus-liquidus interface.

9. A method for forming high quality silicon material for photovoltaic devices, the method comprising:

transferring a raw silicon material in a crucible having an interior region, the crucible being provided within a vessel, the crucible being made of a quartz material, the quartz material being capable of withstanding a temperature of at least 1400° C.;

subjecting the raw silicon material in the crucible to thermal energy to cause the raw silicon material to be melted into a liquid state, the melted material having an exposed region bounded by the interior region of the crucible;

subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible;

providing plasma, gases and chemicals required for purifying in a high-speed jet flow to a surface of the silicon melt through an independent injecting device, the independent injecting device having a chemical and gas supply tube and a high pressure gas supply tube;

raising the crucible via a crucible manipulating device within the vessel to keep a constant level of a liquid surface and to maintain heating of the silicon material at the solidus-liquidus interface;

removing one or more impurities from the melted material to form a higher purity silicon material in the crucible;

outputting an inert gas through a nozzle region to cause a dimple region within a vicinity of the center region of the melted material; and guiding hot gas rising from the surface of the silicon melt through a guiding element configured to cause a portion of evaporated melted material to return to the melted material.

10. The method of claim 9 further comprising providing a cover gas to maintain the melted material within the crucible.

11. A method for forming high quality silicon material for photovoltaic devices, the method comprising:

transferring a raw silicon material in a crucible having an interior region, the crucible being provided within a vessel, the crucible being made of a quartz material, the quartz material being capable of withstanding a temperature of at least 1400° C., subjecting the raw silicon material in the crucible to thermal energy to cause the raw silicon material to be melted into a liquid state, the melted material having an exposed region bounded by the interior region of the crucible;

subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible;

providing plasma, gases and chemicals required for purifying in a high-speed jet flow to the surface of the silicon melt through an independent injecting device, the independent injecting device having a chemical and gas supply tube and a high pressure gas supply tube;

raising the crucible via a crucible manipulating device within the vessel to keep a constant level of the liquid surface and to maintain heating of the silicon material at the solidus-liquidus interface;

removing one or more impurities from the melted material to form a higher purity silicon material in the crucible;

outputting an inert gas through a nozzle region to cause a dimple region within a vicinity of the center region of the melted material; and transporting the crucible through the crucible manipulating device in cooperation with a crucible transporting device and a crucible conveyor belt at the end of the silicon purification process.

12. A method for forming high quality silicon material for photovoltaic devices, the method comprising:

transferring a raw silicon material in a crucible having an interior region, the crucible being provided within a vessel, the crucible being made of a quartz material, the quartz material being capable of withstanding a temperature of at least 1400° C., subjecting the raw silicon material in the crucible to thermal energy to cause the raw silicon material to be melted into a liquid state, the melted material having an exposed region bounded by the interior region of the crucible;

subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible;

providing plasma, gases and chemicals required for purifying in a high-speed jet flow to the surface of the silicon melt through an independent injecting device, the independent injecting device having a chemical and gas supply tube and a high pressure gas supply tube;

raising the crucible via a crucible manipulating device within the vessel to keep a constant level of the liquid surface and to maintain heating of the silicon material at the solidus-liquidus interface;

removing one or more impurities from the melted material to form a higher purity silicon material in the crucible; and outputting an inert gas through a nozzle region to cause a dimple region within a vicinity of the center region of the melted material, wherein the nozzle region comprises a plurality of nozzles and the inert gas comprises an argon gas characterized by a flow rate suitable to form the dimple region comprising a plurality of recessed regions.

13. The method of claim 9 wherein the nozzle region is coupled to an argon gas source, the nozzle region comprising a ceramic material.

14. The method of claim 9 wherein the dimple region provides an increased surface region for a plume to interact with the melted material; wherein the dimple region has a depth of at least one centimeter.

15. The method of claim 9 wherein the melted material comprises a viscosity of 0.7 Pascal-second.

16. A method for forming high quality silicon material for photovoltaic devices, the method comprising:

transferring a raw silicon material in a crucible having an interior region, the crucible being provided within a vessel, the crucible being made of a quartz material, the quartz material being capable of withstanding a temperature of at least 1400° C.;

subjecting the raw silicon material in the crucible to thermal energy to cause the raw silicon material to be melted into a liquid state, the melted material having an exposed region bounded by the interior region of the crucible;

subjecting an exposed inner region of the melted material to an energy source comprising two or more arc heaters symmetrically configured above the exposed region and spaced by a gap between the exposed region and a muzzle region of each of the two or more arc heaters to cause formation of a determined temperature profile within a vicinity of an inner region of the exposed melted material while maintaining outer regions of the melted material at a temperature below a melting point of the quartz material of the crucible, wherein the two or more arc heaters are configured with a focus point below a surface of the melted material;

guiding hot gas rising from the surface of the silicon melt through a guiding element configured to cause a portion of evaporated melted material to return to the melted material; and removing one or more impurities from the melted material to form a higher purity silicon material in the crucible.

17. The method of claim 16 further comprising providing chemicals and gases required for purification and high-pressure damped gas mixtures through an independent injecting device, the independent injecting device having a chemical and gas supply tube and a high pressure gas supply tube, the chemicals and gases required for purification being provided through the chemical and gas supply tube and the high-pressure damped gas mixtures being provided through the high-pressure gas supply tube.

18. The method of claim 16 wherein the crucible is provided within a vessel and further comprising raising the crucible via a crucible manipulating device within the vessel to keep a constant level of the liquid surface and to maintain heating of the silicon material at the solidus-liquidus interface.

* * * * *